United States Patent
Assefa et al.

(10) Patent No.: US 8,541,734 B2
(45) Date of Patent: Sep. 24, 2013

(54) AVALANCHE IMPACT IONIZATION AMPLIFICATION DEVICES

(75) Inventors: Solomon Assefa, Ossining, NY (US);
Yurii A. Vlasov, Katonah, NY (US);
Fengnian Xia, Plainsboro, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,567

(22) Filed: Sep. 5, 2012

(65) Prior Publication Data

US 2012/0326012 A1    Dec. 27, 2012

Related U.S. Application Data (63) Continuation of application No. 13/455,507, filed on Apr. 25, 2012, which is a continuation of application No. 12/533,521, filed on Jul. 31, 2009, now Pat. No. 8,232,516.

(51) Int. Cl.
*H01L 31/00* (2006.01)
*H01L 31/107* (2006.01)

(52) U.S. Cl.
USPC ........................................ 250/214.1; 257/438

(58) Field of Classification Search
USPC ................................. 250/214.1; 257/461, 438
See application file for complete search history.

(56) References Cited

U.S. PATENT DOCUMENTS

| | | | |
|---|---|---|---|
| 5,844,291 A | 12/1998 | Antich et al. | |
| 5,990,490 A | 11/1999 | Tsay | |
| 6,445,019 B2 | 9/2002 | Van Dalen | |
| 6,897,498 B2 | 5/2005 | Gothoskar et al. | |
| 7,012,738 B1 | 3/2006 | Schwarte | |
| 7,266,263 B2 | 9/2007 | Ahn et al. | |
| 7,498,243 B2 | 3/2009 | Liu et al. | |
| 7,515,793 B2 | 4/2009 | Dehlinger et al. | |
| 7,875,522 B2 | 1/2011 | Kapur et al. | |
| 8,232,516 B2 * | 7/2012 | Assefa et al. | 250/214.1 |

* cited by examiner

*Primary Examiner* — Thanh Luu
(74) *Attorney, Agent, or Firm* — Scully, Scott, Murphy & Presser, P.C.; Vazken Alexanian (57) ABSTRACT

A semiconductor photodetector may provide charge carrier avalanche multiplication at high field regions of a semiconductor material layer. A semiconductor current amplifier may provide current amplification by impact ionization near a high field region. A plurality of metal electrodes are formed on a surface of a semiconductor material layer and electrically biased to produce a non-uniform high electric field in which the high electric field strength accelerates avalanche electron-hole pair generation, which is employed as an effective avalanche multiplication photodetection mechanism or as an avalanche impact ionization current amplification mechanism.

19 Claims, 8 Drawing Sheets

AVALANCHE IMPACT IONIZATION AMPLIFICATION DEVICES

CROSS REFERENCE TO RELATED APPLICATION

This application is a continuation of U.S. patent application Ser. No. 13/455,507, filed Apr. 25, 2012, which is a continuation of U.S. patent application Ser. No. 12/533,521, filed Jul. 31, 2009, now U.S. Pat. No. 8,232,516, issued on Jul. 31, 2012, the entire content and disclosure of which is incorporated herein by reference.

BACKGROUND

The present invention relates to semiconductor structures, and particularly to avalanche amplification photodetectors and avalanche impact ionization transistors, and methods of operating the same.

Currently available avalanche photodetectors require about 30V or more in order to achieve a usable level of amplification of generated photo-carriers. Further, currently available avalanche photodetectors require separate regions for absorption and amplification to achieve low noise operation, which are provided by growing various layers having different dopant concentrations and/or types. As a result, the currently available avalanche photodetectors tend to be bulky and expensive to manufacture.

In addition, current amplification in semiconductor devices typically requires large bipolar devices that require additional processing steps than standard complementary metal oxide semiconductor devices.

In view of the above, compact and effective devices for detecting photons and/or amplifying current are desired.

BRIEF SUMMARY

A semiconductor photodetector that provides charge carrier amplification by impact ionization in high fields regions inside a semiconductor material layer and a semiconductor current amplifier that effecting current amplification by impact ionization inside a high field region are provided. A plurality of metal electrodes are formed on a surface of a semiconductor material layer and electrically biased to produce a non-uniform electric field in which the high electric field with strength close to avalanche breakdown accelerates electron-hole pairs over impact ionization threshold thus producing avalanche amplification which is employed as an effective photodetection mechanism or as a current amplification mechanism.

According to an aspect of the present invention, a semiconductor structure is provided, which includes a semiconductor material layer having a doping of a same conductivity type throughout and located on a substrate; at least one first-type metallic electrode located over a top surface of the semiconductor material layer; at least one second-type electrode contacting the semiconductor structure; and a plurality of non-uniform high electric field regions with strength exceeding the impact ionization threshold located in the semiconductor material layer and around angled corners of the at least one first-type electrode, wherein the non-uniform electric field is generated by a voltage bias across the at least one first-type electrode and the at least one second-type electrode. The non-uniform field localized with sub-100 nm around the metal contact has field values higher than the impact ionization threshold of the semiconductor material.

In one embodiment, the semiconductor structure further includes a current detection device configured to measure current that flows through the at least one first-type electrode and the at least one second-type electrode.

In another embodiment, the semiconductor structure further includes at least one third-type electrode contacting the same semiconductor material layer; and a current detection device configured to measure current that flows through the at least one third-type electrode and the at least one second-type electrode, wherein the at least one first first-type electrode is located above a portion of the semiconductor layer including a path of the current.

According to another aspect of the present invention, a method of operating a semiconductor device embodied in a semiconductor structure is provided. The method includes providing a semiconductor structure described above; inducing high electric field regions with strength exceeding impact ionization threshold to induce avalanche amplification of charge carriers in the semiconductor material layer described above; and detecting a change in current through a portion of the semiconductor material layer caused by the avalanche amplification, wherein the portion of the semiconductor material layer includes a portion located between a pair of the plurality of non-uniform high electric field regions.

In one embodiment, the method further includes exposing the semiconductor material layer to electromagnetic radiation having an energy that is greater than a band gap of a semiconductor material of the semiconductor material layer, wherein the avalanche amplification of the carriers generated by the absorption of electromagnetic radiation is induced by high non-uniform electric field regions.

In another embodiment, the method further includes providing a voltage bias across the at least one first-type electrode and the at least one second-type electrode.

DETAILED DESCRIPTION

As stated above, the present invention relates to avalanche amplification photodetectors and avalanche impact ionization transistors, and methods of operating the same, which are now described in detail with accompanying figures. Throughout the drawings, the same reference numerals or letters are used to designate like or equivalent elements. The drawings are not necessarily drawn to scale.

As defined herein, "avalanche amplification" refers to multiplication of charge carriers in a semiconductor material under high electric field through impact ionization.

As defined herein, a first element is "conductively connected to" a second element if there is an electrically conductive path between the first element and the second element that enable conduction of electrical current under an applied electrical voltage bias across the first element and the second element. For the purposes of the present invention, a first element is conductively connected to a second element if a resistance between the first element and the second element does not exceed 1 kΩ.

As defined herein, a "thin material liner" is a material liner that has a thickness not more than 3 nm.

Figure 1:
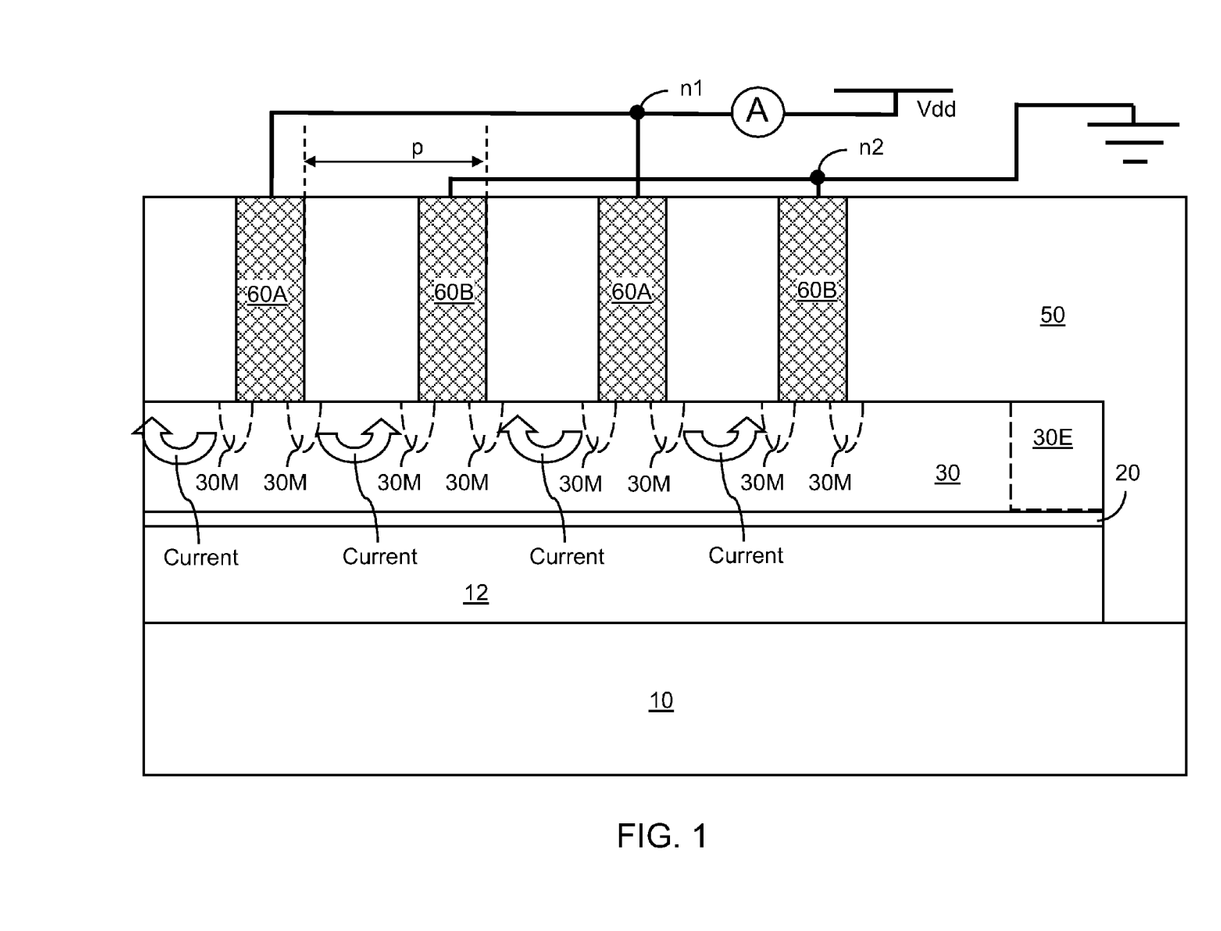
FIG. 1 is a first exemplary semiconductor structure according to a first embodiment of the present invention. A circuit schematic for electrical connection is also shown.

Referring to FIG. 1, a first exemplary semiconductor structure according to a first embodiment of the present invention includes a substrate 10, a waveguide 12 located on a top surface of the substrate 10, a dielectric material layer 20 located on a top surface of the waveguide 12, a semiconductor material layer 30 located on the substrate 10 and above the waveguide 12, an overlying dielectric material layer 50 located above the semiconductor material layer 30, at least one first-type electrode 60A located in proximity to, e.g., over a top surface of, the semiconductor material layer 30 and embedded in the overlying dielectric material layer 50, and at least one second-type electrode 60B located in proximity to, e.g., over the top surface of, the semiconductor material layer 30 and embedded in the overlying dielectric material layer 50. The at least one first-type electrode 60A and at least one second-type electrode 60B are conductively connected to the semiconductor material layer 30. The resistance between the at least one first-type electrode 60A and the semiconductor material layer 30 is less than 1 kΩ, and is preferably less than 100Ω. The resistance between the at least one second-type electrode 60B and the semiconductor material layer 30 is less than 1 kΩ, and is preferably less than 100Ω.

The substrate 10 may be a semiconductor substrate, an insulator substrate, or a conductive substrate having an insulating layer in a top portion thereof. In embodiments in which the substrate 10 is a semiconductor substrate, the substrate may be a bulk substrate, a semiconductor-on-insulator substrate, or a hybrid substrate having a bulk portion and a semiconductor-on-insulator portion. In one example, the substrate is a single crystalline semiconductor substrate. A semiconductor substrate may, or may not, be doped.

Typically, the waveguide 12 is a semiconductor waveguide having a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary case, the semiconductor material of the semiconductor waveguide comprises silicon. In one embodiment, the entirety of the waveguide is single crystalline. In another embodiment, the waveguide 12 has a constant width and a constant height throughout. The width of the waveguide 12 may be from 100 nm to 1000 nm, although lesser and greater widths may be employed. The height of the waveguide 12 may be from 100 nm to 1000 nm, although lesser and greater height may also be employed. The waveguide 12 is config-
ured for transmission of electromagnetic radiation along the lengthwise direction of the waveguide, i.e., in a direction perpendicular to the width and the height of the waveguide 12. The waveguide 12 may be of an integral construction with, and have the same material composition as, a top portion of the substrate 10, or may include a different material from the material of the top portion of the substrate 10.

The dielectric material layer 20 includes a dielectric material such as silicon oxide, silicon nitride, silicon oxynitride, a dielectric metal oxide, or a dielectric metal nitride. Preferably, the thickness of the dielectric material layer 20 is thick enough to electrically isolate the semiconductor material layer 30 from the waveguide 12, and as a result, from the substrate 10. The thickness of the dielectric material layer 20 may be from 1 nm to 80 nm, although lesser and greater thicknesses may also be employed.

The semiconductor material layer 30 is located on a top surface of the dielectric material layer 20. Preferably, the semiconductor material layer 30 has an evanescent coupling with the waveguide 12 through the decaying component of the electromagnetic radiation outside the waveguide 12 that overlaps with the semiconductor material layer 30. The semiconductor material layer 30 includes a photosensitive semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor material layer 30 includes a semiconductor material having a high photosensitivity such as germanium. In some embodiments, the semiconductor material layer 30 is a photosensitive semiconductor material, and the first exemplary semiconductor structure is a photodetector structure.

Preferably, the semiconductor material layer 30 includes a semiconductor material 30 that maximizes the efficiency of photogeneration of charge carriers. In an embodiment of the present invention, the entirety of the semiconductor material layer 30 may be a polycrystalline germanium material.

The entirety of the semiconductor material layer 30 includes an intrinsic semiconductor material or has a doping of the same conductivity type throughout. An intrinsic semiconductor material is a semiconductor material having dopants at a concentration below a trace level, which is typically $1.0 \times 10^{14}/cm^3$. If the semiconductor material layer 30 is doped, the entirety of the semiconductor material layer 30 has the same dopant concentration throughout. In this case, the semiconductor material layer 30 is lightly doped, i.e., at a dopant concentration less than $1.0 \times 10^{17}/cm^3$ throughout.

The thickness of the semiconductor material layer 30 may be from 10 nm to 1,000 nm, although lesser and greater thicknesses may also be employed. The width of the semiconductor material layer 30 may be the same as the width of the waveguide 12, or may be smaller or greater than the width of the waveguide 12. The width of the semiconductor material layer 30 may be from 100 nm to 10 microns, although lesser and greater widths may also be employed.

The overlying dielectric material layer 50 which is formed by conventional methods comprises a dielectric material such as silicon oxide, silicon nitride, an organosilicate glass, a low dielectric constant CVD material having a dielectric constant less than 2.7, a dielectric metal oxide, a dielectric metal nitride, or a polymer. A plurality of via holes is formed, for example, by lithographic methods and an anisotropic etch within the overlying dielectric material layer 50. A top surface of the semiconductor material layer 30 is exposed at the bottom of each via hole. The plurality of via holes may be formed in a one-dimensional array or a two-dimensional array. Preferably, the plurality of via holes is formed at least along the lengthwise direction of the waveguide 30. In case the plurality of via holes may include a one-dimensional array or a two-dimensional array, the pitch of the array in any direction is a lithographic pitch p. Preferably, the lithographic pitch p is a critical pitch, i.e., the smallest pitch that may be printed by lithographic methods. The lithographic pitch p may be from 70 nm to 500 nm, although lesser and greater lithographic pitches may also be employed.

As a result of the small pitch between the electrodes, high electric field can be obtained at small voltages. The high electric field will cause carriers to drift at their saturation velocity. Thus, the device will operate at very high bandwidth (40 GHz or higher). Moreover, the small separation between the electrodes will cause very high fields which induce avalanche amplification at much lower voltage values than reported before.

A conductive material is deposited into the plurality of via holes and is planarized to form the at least one first-type electrode 60A and the at least one second-type electrode 60B. The conductive material may be an elemental metal, a conductive metallic compound, or a heavily doped semiconductor material. Preferably, the conductive material is an elemental metal or a conductive metallic compound such as a conductive intermetallic compound, a conductive metal nitride, or a conductive metal carbide, and each of the at least one first-type electrode 60A is a metal electrode. In one embodiment, the at least one first-type electrode 60A is a single first-type electrode, and the at least one second-type electrode 60B is a single second-type electrode. In this embodiment, the at least one first-type electrode 60A and the at least one second-type electrode 60B are interlaced, i.e., ordered such that one of the at least one first-type electrode 60A has two of the at least one second-type electrode 60B as the most proximately placed electrodes and/or one of the at least one second-type electrode 60B has two of the at least one first-type electrode 60A as the most proximately placed electrodes. The at least one first-type electrode 60A and the at least one second-type electrode 60B may be interlaced with the lithographic pitch p.

Embodiments in which the at least one first-type electrode 60A and/or the at least one second-type electrode 60B contacts, or is/are located in proximity to, any surface of the semiconductor material layer 30 can also be employed.

All of the at least one first-type electrode 60A may be electrically connected to form a single node, which is herein referred to as a first node n1. All of the at least one second-type electrode 60B may be electrically connected to form another single node, which is herein referred to as a second node n2. A voltage bias is applied across the first node n1 and the second node n2. For example, a system power supply voltage Vdd may be applied to the first node, and the second node n2 may be connected to electrical ground. A current measurement device, represented by an ammeter, is connected in a series connection between a device or a structure that applies the system power supply voltage and the first node n1. Alternately, the current measurement device may be connected between the second node n2 and electrical ground. The current detection device is configured to measure current that flows through the at least one first-type electrode 60A and the at least one second-type electrode 60B.

The system power supply voltage Vdd may be from 0.5 V to 5.0 V, and preferably from 1.0 V to 2.5 V, although lesser and greater system power supply voltages may also be employed. Preferably, the system power supply voltage Vdd is also a power supply voltage for at least one complementary metal-oxide-semiconductor (CMOS) device such as a CMOS field effect transistor.

A plurality of non-uniform high electric field regions 30M are formed in the semiconductor material layer 30 by the electrical field that the voltage bias generates. The plurality of non-uniform high electric field regions 30M are multiplication regions in which multiplication of charge carriers occur through avalanche amplification. The plurality of non-uniform electric field regions 30M is formed inside the semiconductor material layer around the angled corners of the at least one first-type metal electrode 60A and the at least one second-type electrode 60B. The plurality of non-uniform high electric field regions 30M are regions in which a sharp angle in a geometric metallic feature induces an enhancement in the strength of the electric field exceeding the impact ionization threshold. For example, if the at least one first-type electrode 60A have a shape of a cylinder having a flat bottom surface, the corners at which the bottom surface meets the sidewalls of the at least one first-type metal electrode 60A is a sharp point at which the strength of the electric field is enhanced by geometry. Further, the closer to the at least one first-type electrode 60A, the greater the strength of the electric field is, that exceeds significantly the impact ionization threshold.

Charge carriers, i.e., electrons and holes, are multiplied within the plurality of non-uniform high electric field regions 30M due to impact ionization induced avalanche amplification. Charge carriers are generated by the absorption of photons and are transported without encountering impact ionization within the portions of the semiconductor material layer 30 that are located outside the plurality of non-uniform high electric field regions 30M. Thus, the plurality of non-uniform high electric field regions 30M constitutes impact ionization amplification regions in which electrical signals in the form of charge carriers are amplified, and the regions of the semiconductor material layer 30 located outside the plurality of non-uniform electric field regions 30M constitute absorption regions in which electrical carriers in the form of charge carriers are generated by absorption of electromagnetic radiation.

Figure 2:
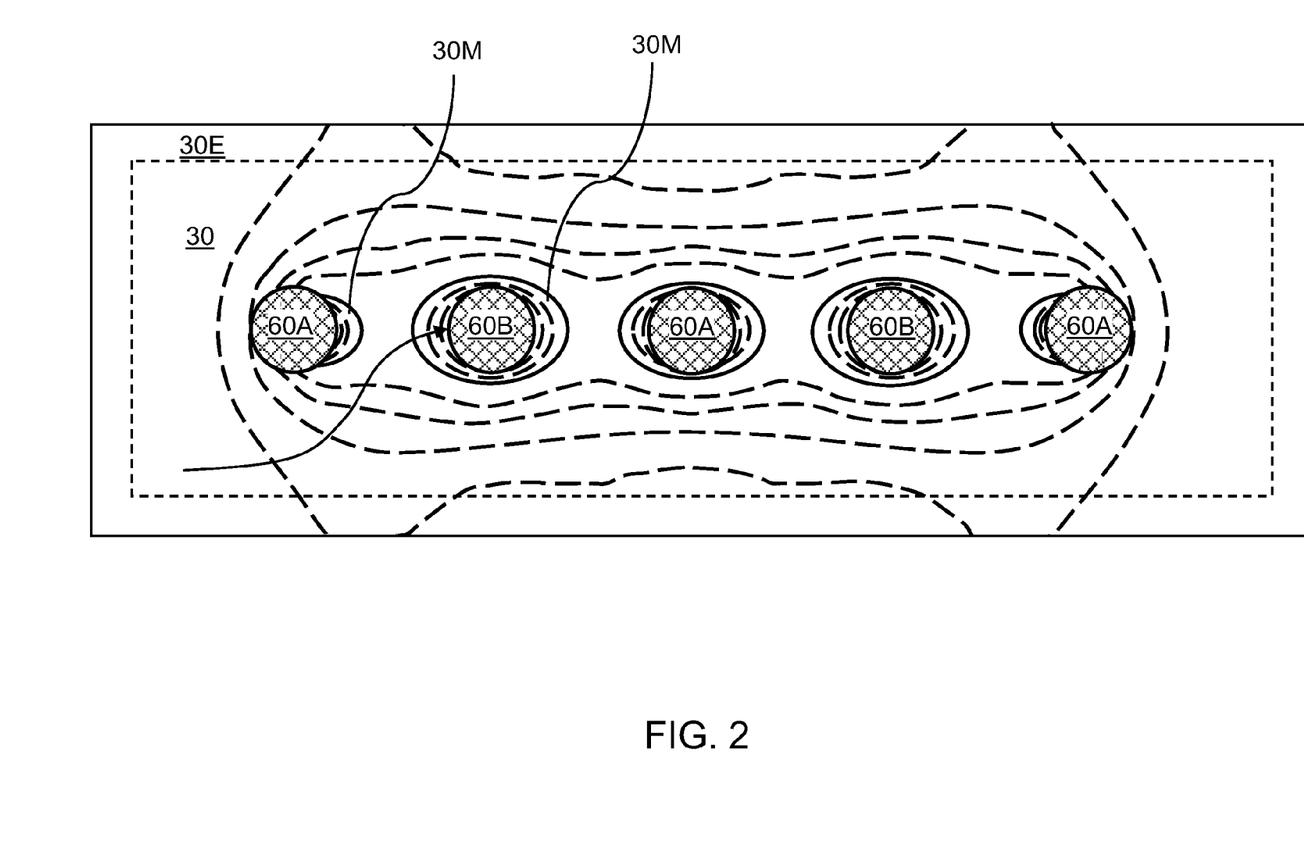
FIG. 2 is a contour map of the electric field strength at the top surface of a semiconductor material layer in an exemplary semiconductor structure according to an embodiment of the present invention. Locations of first-type electrodes 60A and second-type electrodes are also shown.

Referring to FIG. 2, a contour map of the electric field strength close to the top surface of a semiconductor material layer 30 is shown in an exemplary semiconductor structure according to an embodiment of the present invention. Each contour line represents a set of points having a same strength, i.e., magnitude, of the electrical field when a voltage bias is applied across the at least one first-type metal electrode 60A and/or the at least one second-type electrode 60B such that all of the at least one first-type electrode 60A is tied to a first node (not shown) and all of the at least one second-type electrode 60B is tied to a second node (not shown). The change in magnitude of the electric field is the same between each successive pair of contour lines. The magnitude of the electric field increases in the direction of the arrow. Thus, regions of the semiconductor material layer 30 that is immediately adjacent to the at least one first-type electrode 60A and/or the at least one second-type electrode 60B have a greater magnitude of electric field compared to regions separated by a significant distance from the at least one first-type electrode 60A and/or the at least one second-type electrode 60B. Non-uniform high field regions 30M are formed immediately adjacent to at least one first-type electrode 60A and/or the at least one second-type electrode 60B exhibit electric field strength exceeding the impact ionization threshold. The plurality of non-uniform electric field regions 30M are marked by solid lines around the at least one first-type electrode 60A and the at least one second-type electrode 60B.

The magnitude of the voltage bias across the at least one first-type electrode 60A and the at least one second-type electrode 60B is selected such that the electric field in the edge region 30E and other regions of the semiconductor material layer 30 that are located outside the plurality of non-uniform electric field regions 30M is less than a critical field strength that triggers an avalanche amplification of charge carriers in the semiconductor material layer 30. However, the magnitude of the voltage bias across the at least one first-type electrode 60A and the at least one second-type electrode 60B is sufficiently high so that the electric field within the plurality of non-uniform electric field regions 30M is greater than the field strength at or above the critical field strength that triggers an avalanche amplification of charge carriers in the semiconductor material layer 30. The critical field that triggers an avalanche amplification of charge carriers is different for each semiconductor material. For germanium, the critical field is approximately $1 \times 10^5$ V/cm. In case the semiconductor material layer 30 includes single crystalline germanium, the plurality of non-uniform electric field regions 30M has a field strength at or above $1 \times 10^5$ V/cm.

Typically, the non-uniform field region is localized within a sub-100 nm vicinity of the metal electrode. In this non-uniform field region, carriers have to travel a certain distance (called "dead space") to amplification enough energy to cause impact ionization. Thus, there are limited avalanche events occurring in the non-uniform field region. As a result, the noise from avalanche multiplication is suppressed, resulting in high signal to noise ratio while achieving moderately high amplification.

The edge region 30E of the semiconductor material layer 30 thus has an electric field strength that is relatively small in magnitude. Charge carriers are accelerated by non-uniform electric field to drift away from the edge region 30E thus they do not diffuse to the edge region 30E at a significant density, and therefore, this effect prevents the unwanted avalanche breakdown across the surface of the of the semiconductor material layer 30. Instead high non-uniform electric field regions 30M can be formed with electric field strength exceeding impact ionization threshold. Thus, the edge region 30E functions as a guard ring structure that allows the plurality of non-uniform electric field regions 30M to be formed in a semiconductor material layer 30.

In one embodiment, the semiconductor material layer 30 may have a shape of another waveguide so that the electromagnetic radiation within the semiconductor material layer 30 is confined to a center region and is weak in the edge region 30E. In this case, the charge carriers are further confined to the center regions of the semiconductor material layer 30 and outside the edge region 30E.

The first exemplary semiconductor structure as a semiconductor device may be operated by inducing impact ionization and amplification of charge carriers in the semiconductor material layer 30. The electromagnetic radiation is absorbed in semiconductor material layer 30 generating electrons and holes. These charge carriers are drifting by a non-uniform electric field towards electrodes 60A and 60B. Due to non-uniform electric field with the strength increasing towards electrodes 60A and 60B the carriers are accelerated and are entering the high non-uniform electric field regions 30M at non-zero velocities.

The avalanche amplification of charge carriers is provided by impact ionization of semiconductor material when charge carriers accelerated by the non-uniform electric field are entering into one of the plurality of non-uniform electric field regions 30M. Once carriers are entering inside high non-uniform field regions 30M they can generate additional carriers by one or several events of impact ionization. Therefore, the signal carried by electromagnetic radiation is transformed into the form of photocurrent that is electrically amplified by the semiconductor device.

In order to effectively generate charge carriers in the semiconductor material layer 30, it is exposed to electromagnetic radiation having an energy that is greater than the band gap of the semiconductor material of the semiconductor material layer 30. In this case, the electromagnetic radiation is absorbed in semiconductor material generating electron hole pairs. The electromagnetic radiation may be transmitted through the waveguide 12, which is configured to have an evanescent coupling with the semiconductor material layer 30. Thus, the photons in the waveguide 12 may trigger an avalanche amplification of charge carriers in layer 30 within the plurality of non-uniform electric field regions 30M.

The first exemplary semiconductor structure has a small volume for each of the plurality of non-uniform electric field regions 30M and a limited number of multiplication events, thereby minimizing the electronic noise that may be generated in an amplification process. This results in low excess noise factor with ratio of ionization factors (effective k) below 0.2 providing high sensitivity improvement (high signal to noise ratio) for the photodetector. Because of the closely spaced contacts, the photodetector can operate at speed of 40 GHz while achieving amplification of over 10 dB, thus resulting in amplification-bandwidth product higher than 300. The sensitivity improvement can exceed 10 dBm.

Previously, germanium avalanche photodetectors were ruled out as not useful because of the high noise associated with the amplification process (high excess noise factor) due to high ratio for impact ionization factors (effective k). With the proposed contact structure, germanium avalanche photodetectors germanium avalanche photodetectors can have low multiplication noise because the effective k can be reduced below 0.2, resulting in high sensitivity improvement.

Surface effects such as plasmonics are utilized to minimize unwanted absorption of photons by metal in at least first type-electrodes 60A within and around the plurality of non-uniform electric field regions 30M. Further, because a relative high electrical field strength that is sufficient to cause avalanche amplification may be achieved through the geometry of the at least one first-type electrode 60A and the at least one second-type electrode 60B, the system power supply voltage may be a common voltage as a power supply voltage for CMOS transistors. In addition, the manufacturing process is simplified because the doping of the semiconductor material layer 30 may be the same throughout.

Figure 3:
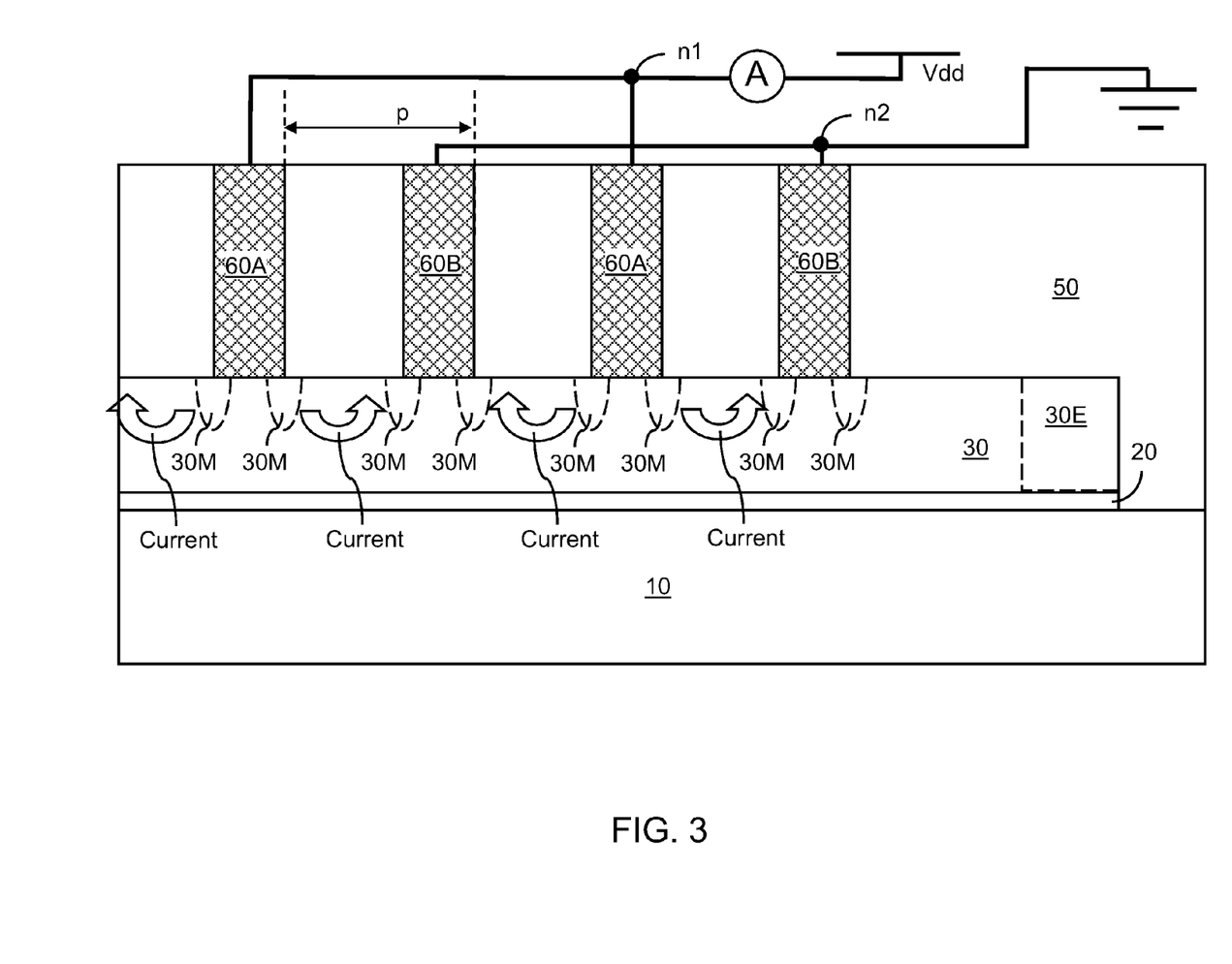
FIG. 3 is a second exemplary semiconductor structure according to a second embodiment of the present invention. A circuit schematic for electrical connection is also shown.

Referring to FIG. 3, a second exemplary semiconductor structure according to a second embodiment of the present invention is derived by removing the waveguide 12 from the first exemplary semiconductor structure. In this case, electromagnetic radiation impinges through the overlying dielectric material layer 50 of the substrate 10 and the dielectric material layer 20.

In one embodiment, the overlying dielectric material layer 50 is an optically transparent material such as silicon oxide, and photons in electromagnetic radiation propagate through the overlying dielectric material layer 50 onto the semiconductor material layer 30. In another embodiment, the substrate 10 and the dielectric material layer 20 are optically transparent material such as silicon dioxide, and photons in electromagnetic radiation propagates through the substrate 10 and the dielectric material layer 20. The optically transparent material does not absorb electromagnetic radiation over at least a portion of the wavelength range in which the material of the semiconductor material layer 30 absorbs photons.

Figure 4:
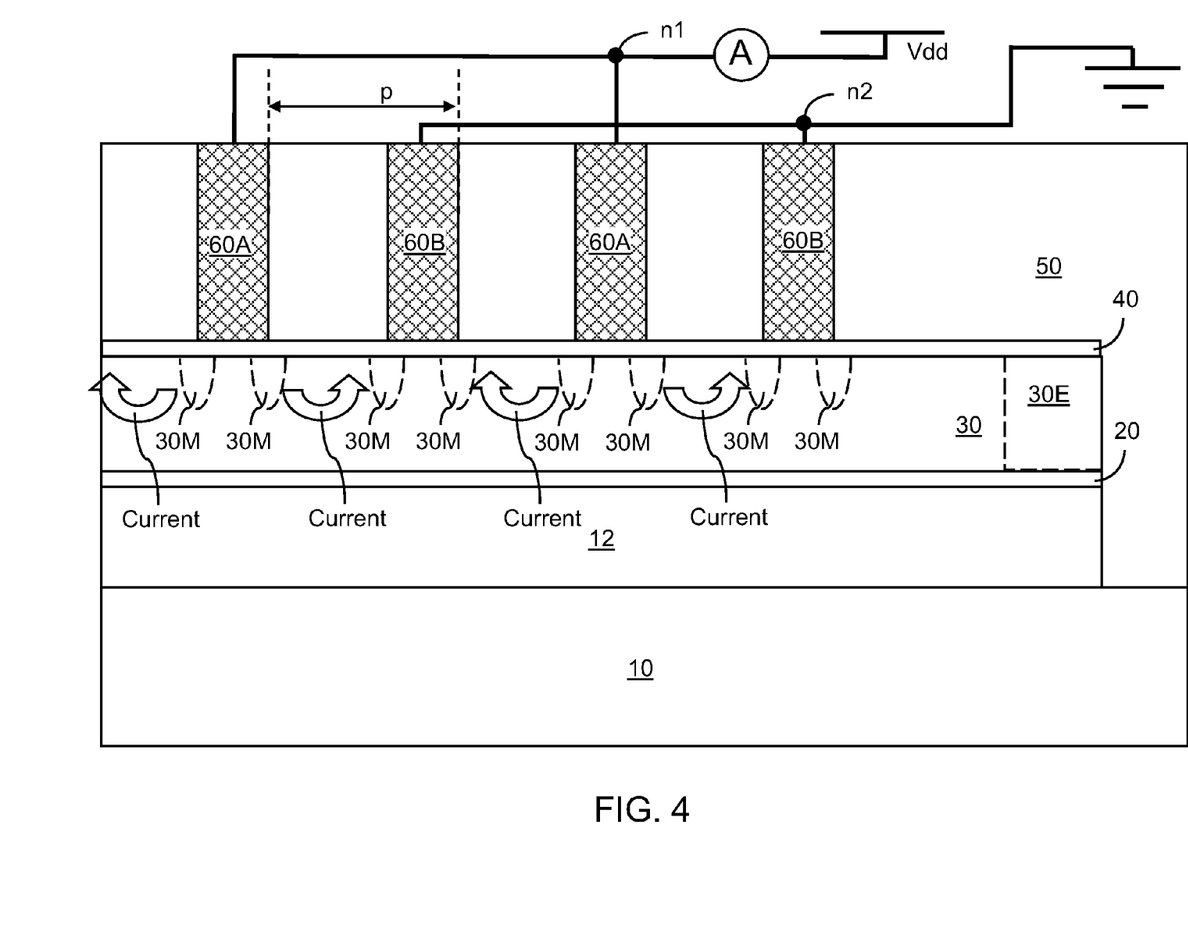
FIG. 4 is a third exemplary semiconductor structure according to a third embodiment of the present invention. A circuit schematic for electrical connection is also shown.

Referring to FIG. 4, a third exemplary semiconductor structure according to a third embodiment of the present invention is derived from the first or second exemplary semiconductor structure by forming a thin material liner 40 directly on the top surface of the semiconductor material layer 30. The thin material liner 40 contacts the bottom surface of each of the at least one first-type electrode 60A and the at least one second-type electrode 60B. The thin material liner 40 vertically separates the semiconductor material layer 30 from each of the at least one first-type electrode 60A and the at least one second-type electrode 60B. The overlying dielectric material layer 50 contacts the top surface of the thin material liner 40.

The thin material liner 40 has a dielectric material that unpins the Fermi level at the surface of the semiconductor material layer 30. The unpinning of the Fermi level reduces the dark current, which is a steady state current that flows between the at least one first-type electrode 60A and the at least one second-type electrode 60B in the absence of any electromagnetic radiation in the semiconductor material layer 30. The reduction of the dark current enhances the signal-to-noise ratio of the photodetector of the first exemplary semiconductor structure.

The thin material liner 40 may be silicon oxide, silicon nitride, a dielectric metal oxide, or a dielectric metal nitride. The thin material liner 40 may be replaced with a layer of a wide band gap material such as a silicon carbide layer in some embodiments. The thin material liner 40 is thin enough not to increase the contact resistance significantly, and not to reduce the strength of the electric field around the corners of the at least one first-type electrode 60A and the at least one second-type electrode 60B significantly. For example, the thickness of the dielectric layer 40 may be from 1 nm to 3 nm, although lesser and greater thicknesses may also be employed.

The resistance of the thin material liner 40 is small enough to maintain a conductive connection between the semiconductor substrate 30 and the at least one first-type electrode 60A and the at least one second-type electrode 60B. Thus, the resistance between the at least one first-type electrode 60A and the semiconductor material layer 30 is less than 1 k$\Omega$, and is preferably less than 100$\Omega$. The resistance between the at least one second-type electrode 60B and the semiconductor material layer 30 is less than 1 k$\Omega$, and is preferably less than 100$\Omega$.

Figure 5:
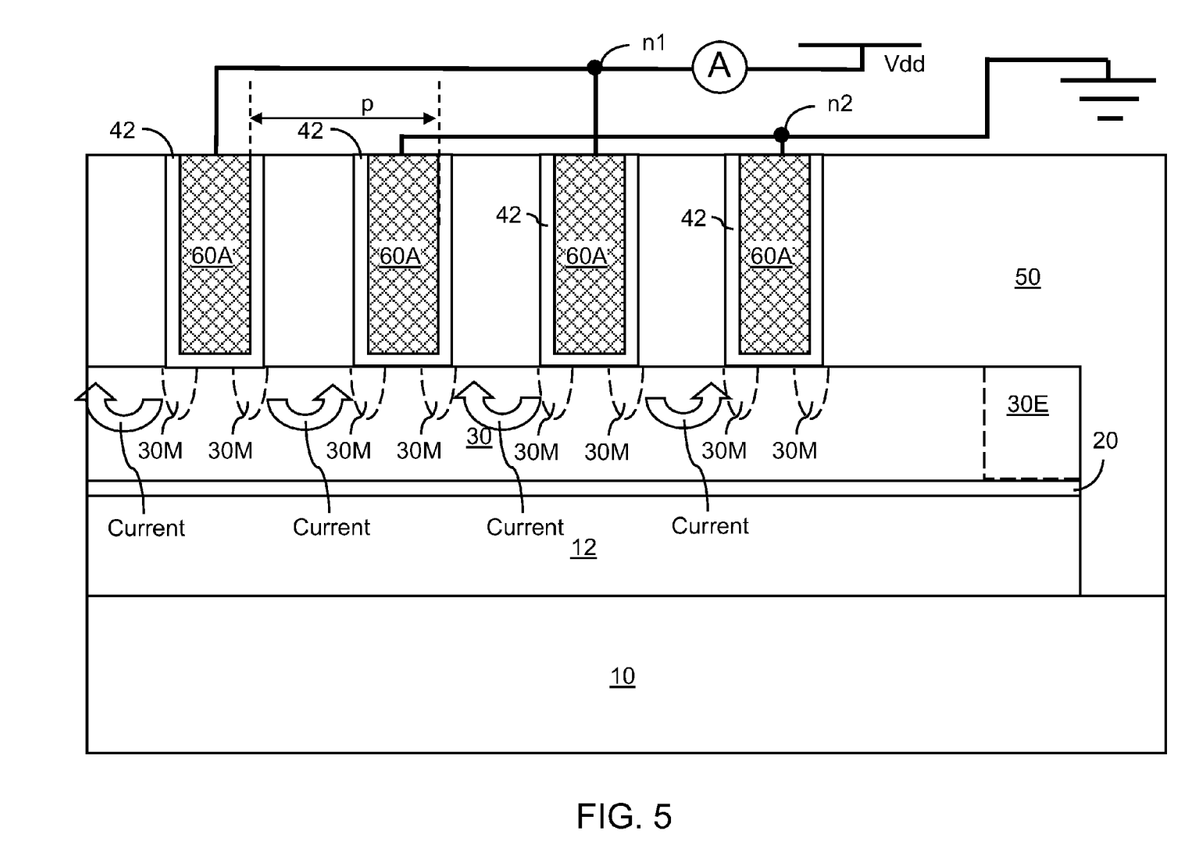
FIG. 5 is a fourth exemplary semiconductor structure according to a fourth embodiment of the present invention. A circuit schematic for electrical connection is also shown.

Referring to FIG. 5, a fourth exemplary semiconductor structure according to a fourth embodiment of the present invention is derived from the first or second exemplary semiconductor structure by depositing a thin material liner 42 on the exposed portion of the top surface of the semiconductor material layer 30 and the sidewalls within each via holes in the overlying dielectric material layer 50. Subsequently, a conductive material is deposited in the via holes and planarized to form at least one first-type electrode 60A and at least one second-type electrode 60B. The plurality of thin material liners 42 directly contacts sidewall surfaces and bottom surface of each of the at least one first-type electrode 60A and the at least one second-type electrode 60B and the top surface of the semiconductor material layer 30. The plurality of thin material liners 42 unpins the Fermi level in the same manner as the thin material liner 40 in the third exemplary semiconductor structure. The composition and thickness of the thin material liner 42 may be the same as the thin material liner 40 of the third exemplary semiconductor structure.

The resistance of the thin material liner 42 is small enough to maintain a conductive connection between the semiconductor substrate 30 and the at least one first-type electrode 60A and the at least one second-type electrode 60B. Thus, the resistance between the at least one first-type electrode 60A and the semiconductor material layer 30 is less than 1 k$\Omega$, and is preferably less than 100$\Omega$. The resistance between the at least one second-type electrode 60B and the semiconductor material layer 30 is less than 1 k$\Omega$, and is preferably less than 100$\Omega$.

Figure 6:
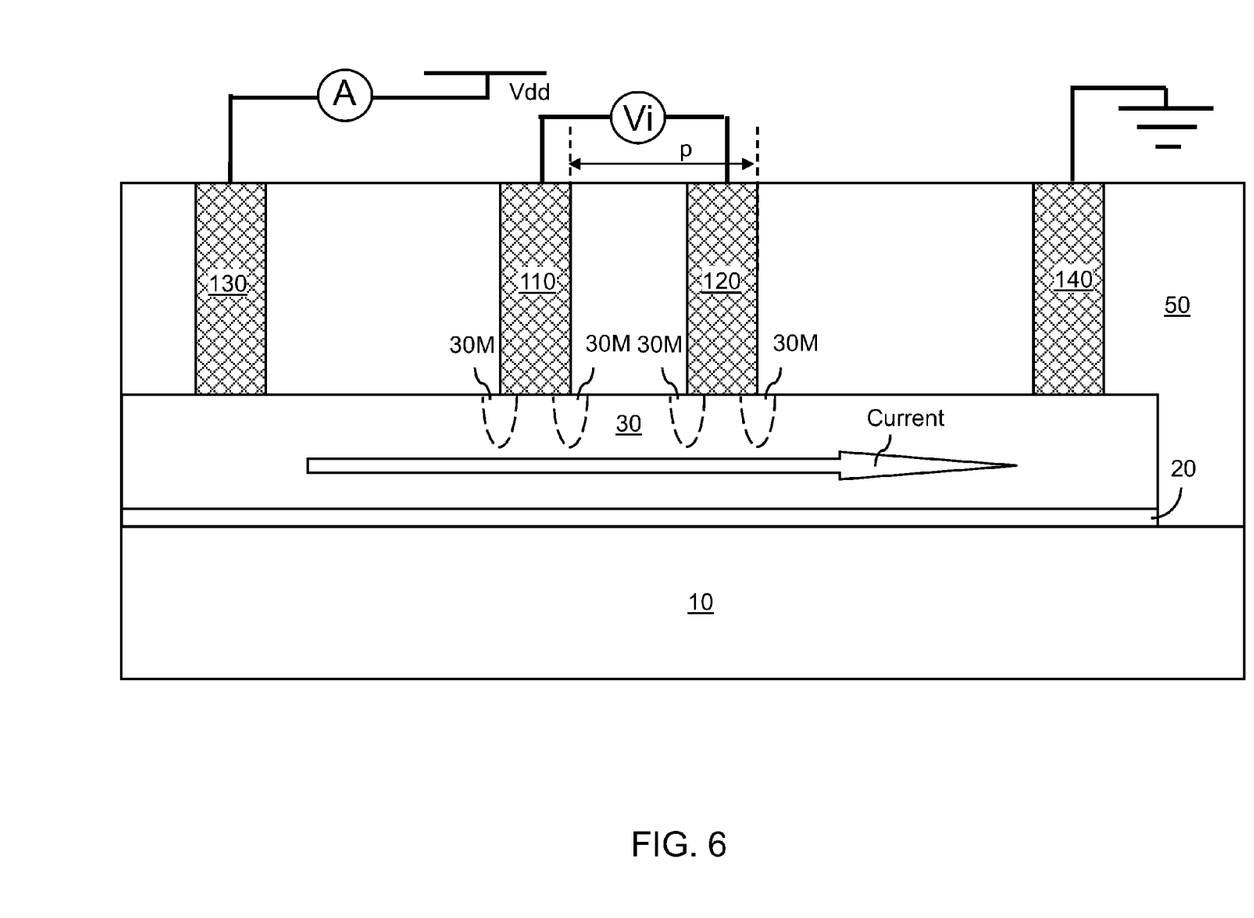
FIG. 6 is a fifth exemplary semiconductor structure according to a fifth embodiment of the present invention. A circuit schematic for electrical connection is also shown.

Referring to FIG. 6, a fifth exemplary semiconductor structure according to a fifth embodiment of the present invention includes a substrate 10, a dielectric material layer 20 located on the top surface of the substrate 10, a semiconductor material layer 30 located on the dielectric material layer 20, an overlying dielectric material layer 50 that is located above the semiconductor material layer 30, at least one first-type electrode 110, at least one second-type electrode 120, at least one third-type electrode 130, and at least one fourth-type electrode 140.

Each of the at least one first-type electrode 110, at least one second-type electrode 120, at least one third-type electrode 130, and at least one fourth-type electrode 140 is located in proximity to, e.g., over the top surface of, the semiconductor material layer 30 and is embedded in the overlying dielectric material layer 50. The at least one first-type electrode 110, at least one second-type electrode 120, at least one third-type electrode 130, and at least one fourth-type electrode 140 can contact the top surface of the semiconductor material layer 30. In case a plurality of electrode is provided for electrodes (110, 120, 130, 140) of any type, the electrodes of the same type are connected in a parallel electrical connection.

Embodiments in which the at least one first-type electrode 110, the at least one second-type electrode 120, the at least one third-type electrode 130, and/or the at least one fourth-type electrode 140 contacts, or is/are located in proximity to, any surface of the semiconductor material layer 30 can also be employed.

The resistance between the at least one first-type electrode 110 and the semiconductor material layer 30 is less than 1 k$\Omega$, and is preferably less than 100$\Omega$. The resistance between the at least one second-type electrode 120 and the semiconductor material layer 30 is less than 1 k$\Omega$, and is preferably less than 100$\Omega$. The resistance between the at least one third-type electrode 130 and the semiconductor material layer 30 is less than 1 k$\Omega$, and is preferably less than 100$\Omega$. The resistance between the at least one fourth-type electrode 140 and the semiconductor material layer 30 is less than 1 k$\Omega$, and is preferably less than 100$\Omega$.

Each of the electrodes (110, 120, 130, 140) may be an elemental metal, a conductive metallic compound, or a heavily doped semiconductor material. Preferably, the conductive material is an elemental metal or a conductive metallic compound such as a conductive intermetallic compound, a conductive metal nitride, or a conductive metal carbide, and each of the electrodes (110, 120, 130, 140) is a metal electrode.

The at least one third-type electrode 130 and the at least one fourth-type electrode 140 are located outside the at least one first-type electrode 110 and at least one second-type electrode 120. A voltage bias is applied across the at least one third-type electrode 130 and the at least one fourth-type electrode 140. For example, a system power supply voltage Vdd may be applied to the at least one third-type electrode 130, and at least one fourth-type electrode may be connected to electrical ground. A current measurement device, represented by an ammeter, is connected in a series connection between a device or a structure that applies the system power supply voltage Vdd and the at least one third-type electrode 130. Alternately, the current measurement device may be connected between the at least one fourth-type electrode and electrical ground. The current detection device is configured to measure current that flows through the at least one third-type electrode 130 and the at least one fourth-type electrode 140.

The at least one first-type electrode 110 and the at least one second-type electrode 120 are located above a portion of the semiconductor layer 30 that includes a path of the current between the at least one third-type electrode 130 and the at least one fourth-type electrode 140. A variable voltage bias is applied across the at least one first-type electrode 110 and the at least one second-type electrode 120. The variable voltage bias may be generated by any type of device, represented by the symbol Vi, that is configured to generate or receive such a variable voltage including, but not limited to, a semiconductor device, an optical device, or any electromechanical device.

A plurality of non-uniform electric field regions 30M are formed in the semiconductor material layer 30 by the electrical field that the voltage bias generates in the same manner as in the first through fourth embodiments. The plurality of non-uniform electric field regions 30M is formed around the angled corners of the at least one first-type electrode 110 and the at least one second-type electrode 120. The plurality of non-uniform electric field regions 30M are regions in which a sharp angle in a geometric feature induces an enhancement in the strength of the electric field as in the first through fourth embodiments. Charge carriers are multiplied within the plurality of non-uniform electric field regions 30M. Thus, the plurality of non-uniform electric field regions 30M constitutes amplification regions in which electrical signals in the form of charge carriers are amplified.

The electrical current through the at least one third-type electrode 130, the semiconductor material layer 30, and the at least one fourth-type electrode 140 is modulated by the electrical bias across the at least one first-type electrode 110 and the at least one second-type electrode 120. The magnitude of the electrical current depends on the strength of the electrical field in the plurality of non-uniform electric field regions 30M.

The presence and the size of the plurality of non-uniform electric field regions 30M depends on the magnitude of the voltage bias across the at least one first-type electrode 110 and the at least one second-type electrode 120. The plurality of non-uniform electric field regions 30M disappears if the magnitude of the voltage bias decreases below a critical voltage that is needed to generate the critical field strength that triggers an avalanche amplification of charge carriers in the semiconductor material layer 30 anywhere in the semiconductor material layer 30. As the magnitude of the voltage bias increases above the critical voltage, the plurality of non-uniform electric field regions 30M is generated. The size of the plurality of non-uniform electric field regions 30M grows with the magnitude of the voltage bias beyond the critical voltage. Thus, the fifth exemplary semiconductor structure may be employed a semiconductor based current switch or a current amplifier that depends on the voltage bias as the input and generates a modulation of the magnitude of electric current between the at least one third-type electrode 130 and the at least one fourth-type electrode 140.

Figure 7:
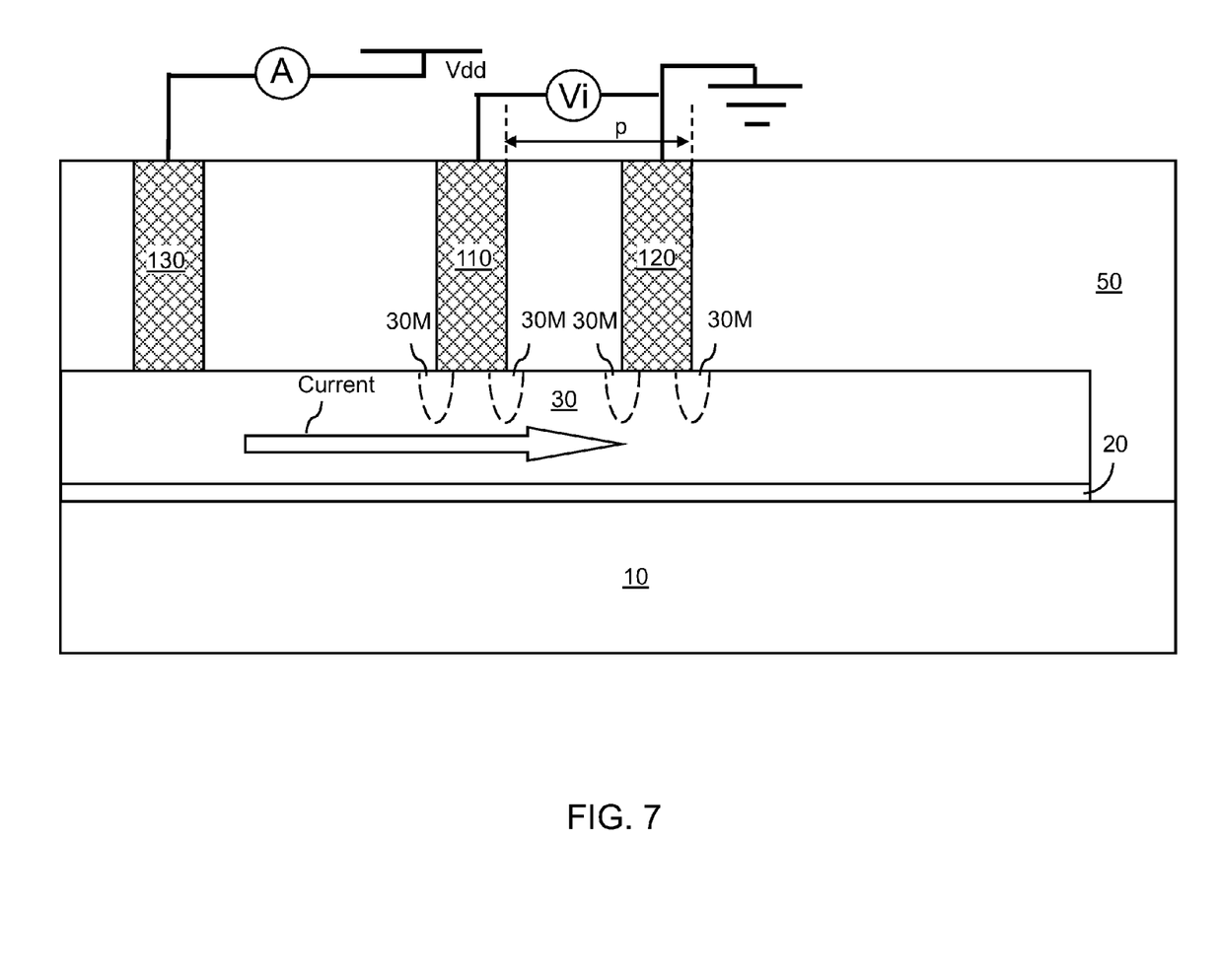
FIG. 7 is a sixth exemplary semiconductor structure according to a sixth embodiment of the present invention. A circuit schematic for electrical connection is also shown.

Referring to FIG. 7, a sixth exemplary semiconductor structure according to a sixth embodiment of the present invention includes a substrate 10, a dielectric material layer 20 located on the top surface of the substrate 10, a semiconductor material layer 30 located on the dielectric material layer 20, an overlying dielectric material layer 50 that is located above the semiconductor material layer 30, at least one first-type electrode 110, at least one second-type electrode 120, and at least one third-type electrode 130.

In the sixth exemplary semiconductor structure, the functionality of the at least one fourth-type electrode 140 and the functionality of the at least one second-type electrode 120 in FIG. 6 are provided by the at least one second-type electrode 120 that is electrically grounded. In this case, however, only the first-type electrode 110 may be electrically floating as an input node.

The at least one third-type electrode 130 and the at least one second-type electrode 120 are located outside the at least one first-type electrode 110. A voltage bias is applied across the at least one third-type electrode 130 and the at least one second-type electrode 140. For example, a system power supply voltage Vdd may be applied to the at least one third-type electrode 130. A current measurement device, represented by an ammeter, is connected in a series connection between a device or a structure that applies the system power supply voltage Vdd and the at least one third-type electrode 130. Alternately, the current measurement device may be connected between the at least one second-type electrode 120 and electrical ground. The current detection device is configured to measure current that flows through the at least one third-type electrode 130 and the at least one second-type electrode 120.

The resistance between the at least one first-type electrode 110 and the semiconductor material layer 30 is less than 1 kΩ, and is preferably less than 100Ω. The resistance between the at least one second-type electrode 120 and the semiconductor material layer 30 is less than 1 kΩ, and is preferably less than 100Ω. The resistance between the at least one third-type electrode 130 and the semiconductor material layer 30 is less than 1 kΩ, and is preferably less than 100Ω.

Figure 8:
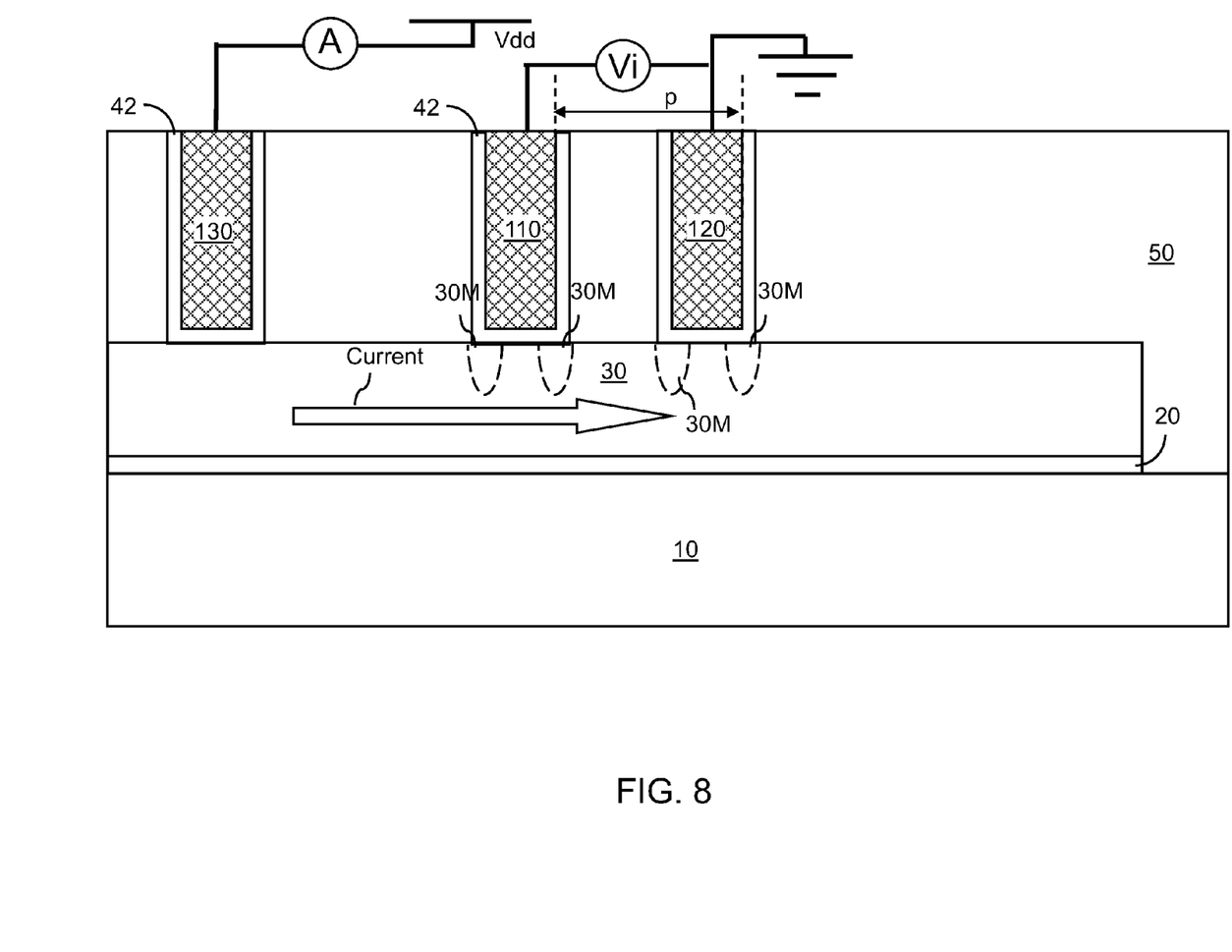
FIG. 8 is a seventh exemplary semiconductor structure according to a seventh embodiment of the present invention. A circuit schematic for electrical connection is also shown.

Referring to FIG. 8, a seventh exemplary semiconductor structure according to a seventh embodiment of the present invention is derived from the sixth exemplary semiconductor structure described by adding a plurality of thin material liners 42 in the same manner as in the fourth embodiment. Likewise, a thin material liner 40 or a plurality of thin material liners 42 may be added to the sixth and/or seventh exemplary semiconductor structures.

The fifth through seventh exemplary semiconductor structures function as a current switch or a current amplifier even when the polarity of the voltage bias is reversed between the at least one first-type electrode 110 and the at least one second-type electrode 120. Reversing the polarity of the voltage bias may alter the magnitude of the critical voltage due to the built-in electric field between the at least one third-type electrode 130 and the at least one fourth-type electrode 140. However, the current modulation characteristic remains substantially the same even after reversal of the polarity. When the applied voltage bias across the at least one first-type electrode 110 and the at least one second-type electrode alternates and changes polarity, the fifth exemplary semiconductor structure may be employed as a frequency doubler in which the magnitude of the electrical current between the at least one third-type electrode 130 and the at least one fourth-type electrode 140 changes at double the frequency of the applied bias voltage.

The non-uniform field region is localized within sub-100 nm from the electrodes. The carrier has to travel a certain distance in this high field region before it can cause impact ionization. Thus, there are only a few avalanche mechanism events occurring in this region. As a result, the noise from avalanche multiplication is highly suppressed, resulting in high signal to noise ratio while still achieving moderately high amplification.

The resistance between the at least one first-type electrode 110 and the semiconductor material layer 30 is less than 1 kΩ, and is preferably less than 100Ω. The resistance between the at least one second-type electrode 120 and the semiconductor material layer 30 is less than 1 kΩ, and is preferably less than 100Ω. The resistance between the at least one third-type electrode 130 and the semiconductor material layer 30 is less than 1 kΩ, and is preferably less than 100Ω. The resistance between the at least one fourth-type electrode 140 and the semiconductor material layer 30 is less than 1 kΩ, and is preferably less than 100Ω. The resistance of the thin material liner 42 or the resistance of the thin material liner 40 is small enough to maintain a conductive connection between the semiconductor substrate 30 and each of the at least one first-type electrode 110, the at least one second-type electrode 120, the at least one third-type electrode 130, the at least one fourth-type electrode 140.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor material layer having a doping of a same conductivity type throughout and located on a substrate;
   at least one first-type electrode having angled corners and conductively connected to said semiconductor material layer and having a bottommost surface located above a top surface of said semiconductor material layer;
   at least one second-type electrode conductively connected to said semiconductor material layer; and
   a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage, wherein said at least one first-type electrode and said at least one second-type electrode are in contact with said semiconductor material layer.

2. The semiconductor structure of claim 1, further comprising a thin material liner in contact with a surface of said semiconductor material layer and all of said at least one first-type electrode and said second-type electrode.

3. The semiconductor structure of claim 1, wherein said semiconductor material layer contains germanium.

4. The semiconductor structure of claim 1, wherein said plurality of non-uniform electric field regions is generated by a voltage-bias-generating device that applies a voltage bias across said at least one first-type electrode and said at least one second-type electrode.

5. The semiconductor structure of claim 4, wherein said voltage-bias-generating device is a device that is configured to generate a direct current (DC) voltage bias.

6. A semiconductor structure comprising:
   a semiconductor material layer having a doping of a same conductivity type throughout and located on a substrate;
   at least one first-type electrode having angled corners and conductively connected to said semiconductor material layer and having a bottommost surface located above a top surface of said semiconductor material layer;
   at least one second-type electrode conductively connected to said semiconductor material layer; and
   a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage, wherein said plurality of non-uniform electric field regions has a field strength at or above a critical field strength that triggers impact ionization and amplification of charge carriers in said semiconductor material.

7. A semiconductor structure comprising:
   a semiconductor material layer having a doping of a same conductivity type throughout and located on a substrate;
   at least one first-type electrode having angled corners and conductively connected to said semiconductor material layer and having a bottommost surface located above a top surface of said semiconductor material layer;
   at least one second-type electrode conductively connected to said semiconductor material layer;
   a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage; and
   a waveguide located underneath said semiconductor material layer and configured to have an evanescent coupling with said semiconductor material layer.

8. The semiconductor structure of claim 7, further comprising a current detection device configured to measure current that flows through said at least one first-type electrode and said at least one second-type electrode.

9. The semiconductor structure of claim 8, wherein said semiconductor material layer is a photosensitive semiconductor material that generates electron-hole pairs upon irradiation by electromagnetic radiation and said semiconductor structure is a photodetector structure.

10. A semiconductor structure comprising:
    a semiconductor material layer having a doping of a same conductivity type throughout and located on a substrate;
    at least one first-type electrode having angled corners and conductively connected to said semiconductor material layer and having a bottommost surface located above a top surface of said semiconductor material layer;
    at least one second-type electrode conductively connected to said semiconductor material layer;
    a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage; and
    a plurality of thin material liners directly contacting a surface of said semiconductor material layer and sidewalls of said at least one first-type electrode, wherein said plurality of thin material liners conduct electricity.

11. The semiconductor structure of claim 1, further comprising:
    A semiconductor structure comprising:
       a semiconductor material layer having a doping of a same conductivity type throughout and located on a substrate;

at least one first-type electrode having angled corners and conductively connected to said semiconductor material layer and having a bottommost surface located above a top surface of said semiconductor material layer;

at least one second-type electrode conductively connected to said semiconductor material layer;

a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage, at least one third-type electrode conductively connected to said semiconductor material layer; and a current detection device configured to measure electrical current that flows through said at least one third-type electrode and said at least one second-type electrode, wherein said at least one first first-type electrode overlies a portion of said semiconductor layer that includes a path of said current.

12. The semiconductor structure of claim 11, further comprising a device configured to provide a variable voltage bias across said at least one first-type electrode and at least one second-type electrode.

13. A method of operating a semiconductor device embodied in a semiconductor structure, said method comprising:

providing a semiconductor structure comprising:

a semiconductor material layer having a doping of a same conductivity type throughout and located on a substrate;

at least one first-type electrode having angled corners and conductively connected to said semiconductor material layer and having a bottommost surface located above a top surface of said semiconductor material layer;

at least one second-type electrode conductively connected to said semiconductor material layer; and a plurality of non-uniform electric field regions located in said semiconductor material layer and around said angled corners of said at least one first-type electrode, wherein said at least one first-type electrode is at a first voltage and said at least one second-type electrode is at a second voltage that is different from said first voltage;

inducing impact ionization and avalanche multiplication of charge carriers in said semiconductor material layer of said semiconductor structure; and detecting a change in electrical current through a portion of said semiconductor material layer caused by said avalanche amplification.

14. The method of claim 13, further comprising providing a direct current (DC) voltage bias across said at least one first-type electrode and said at least one second-type electrode, and said electrical current flows through said at least one first-type electrode and said at least one second-type electrode.

15. The method of claim 13, further comprising exposing said semiconductor material layer to electromagnetic radiation having an energy that is greater than a band gap of a semiconductor material of said semiconductor material layer, wherein electron-hole pairs are generated in said semiconductor material by said electromagnetic radiation.

16. The method of claim 13, wherein said semiconductor structure further includes a waveguide located underneath said semiconductor material layer and configured to have an evanescent coupling with said semiconductor material layer, and said method further includes transmitting said electromagnetic radiation through said waveguide.

17. The method of claim 13, wherein said semiconductor structure further includes a plurality of thin material layers directly contacting a surface of said semiconductor material layer and sidewalls of said at least one first-type electrode, wherein said electrical current flows through at least one of said plurality of thin material layers.

18. The method of claim 13, wherein said semiconductor structure further includes at least one third-type electrode conductively connected to said semiconductor material layer, and wherein said method includes applying a voltage signal across said at least one first-type electrode and said at least one second-type electrode, and said electrical current flows through said at least one third-type electrode and said at least one second-type electrode, wherein said at least one first first-type electrode is located above a portion of said semiconductor layer that includes a path of said electrical current.

19. The method of claim 13, wherein said semiconductor structure further includes at least one third-type electrode and at least one fourth-type electrode that are conductively connected to said semiconductor material layer, and wherein said method includes applying a voltage signal across said at least one first-type electrode and said at least one second-type electrode, and said electrical current flows through said at least one third-type electrode and said at least one fourth-type electrode, wherein said at least one first first-type electrode and said at least one second-type electrode are located above a portion of said semiconductor layer that includes a path of said electrical current.

* * * * *